(12) United States Patent
Pierrat et al.

(10) Patent No.: US 6,681,379 B2
(45) Date of Patent: Jan. 20, 2004

(54) PHASE SHIFTING DESIGN AND LAYOUT FOR STATIC RANDOM ACCESS MEMORY

(75) Inventors: Christophe Pierrat, Santa Clara, CA (US); Michel Luc Côté, San Jose, CA (US)

(73) Assignee: Numerical Technologies, Inc., San Jose, CA (US)

( * ) Notice: Subject to any disclaimer, the term of this patent is extended or adjusted under 35 U.S.C. 154(b) by 90 days.

(21) Appl. No.: 09/996,973

(22) Filed: Nov. 15, 2001

(65) Prior Publication Data

US 2002/0129327 A1 Sep. 12, 2002

Related U.S. Application Data

(63) Continuation-in-part of application No. 09/669,359, filed on Sep. 26, 2000.
(60) Provisional application No. 60/325,689, filed on Sep. 28, 2001, provisional application No. 60/304,142, filed on Jul. 10, 2001, provisional application No. 60/296,788, filed on Jun. 8, 2001, and provisional application No. 60/215,938, filed on Jul. 5, 2000.

(51) Int. Cl.[7] .............................................. G06F 17/50
(52) U.S. Cl. .............................. 716/19; 716/20; 716/21; 438/241; 438/520; 438/585
(58) Field of Search ........................... 716/19; 708/520; 438/585, 241; 430/5, 11; 365/63, 154; 361/234; 333/24 C; 257/377, 296, 202

(56) References Cited

U.S. PATENT DOCUMENTS

| 4,037,918 | A |   | 7/1977 | Kato ........................... 350/3.5 |
| 4,456,371 | A |   | 6/1984 | Lin .............................. 355/71 |
| 5,296,729 | A | * | 3/1994 | Yamanaka et al. .......... 257/377 |
| 5,302,477 | A |   | 4/1994 | Dao et al. ....................... 430/5 |
| 5,308,741 | A |   | 5/1994 | Kemp ........................ 430/312 |

(List continued on next page.)

FOREIGN PATENT DOCUMENTS

| DE | 195 45 163 A1 | 6/1996 |
| EP | 0 464 492 A1 | 1/1992 |
| EP | 0 653 679 A2 | 5/1995 |
| EP | 0 698 821 | 2/1996 |
| GB | 2333613 A | 7/1999 |
| JP | 62067547 | 3/1987 |
| JP | 2-140743 | 5/1990 |
| JP | 7-111528 | 2/1991 |
| JP | 6-67403 | 3/1994 |
| JP | 8-51068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 5/2001 |
| WO | WO 02/03140 A1 | 1/2002 |

OTHER PUBLICATIONS

Ackmann, P., et al., "Phase Shifting and Optical Proximity Corrections to Improve CD Control on Logic Devices in Manufacturing for Sub 0.35 um I–Line", Advance Micro Device (8 pages).

(List continued on next page.)

*Primary Examiner*—Vuthe Siek
*Assistant Examiner*—Yelena Rossoshek
(74) *Attorney, Agent, or Firm*—Erik L. Oliver; Haynes Beffel & Wolfeld LLP

(57) ABSTRACT

Methods and apparatuses for fully defining static random access memory (SRAM) using phase shifting layouts are described. The approach includes identifying that a layout includes SRAM cells and defining phase shifting regions in a mask description to fully define the SRAM cells. The phase conflicts between adjacent phase shifters are resolved by selecting cutting patterns designed for the SRAM shape and functional structure. Additionally, the transistor gates of the SRAM cells can be reduced in size relative to the original SRAM layout design. Thus, an SRAM cell can be lithographically printed with small, consistent critical dimensions including extremely small gate lengths resulting in higher yields and improved performance.

24 Claims, 10 Drawing Sheets

U.S. PATENT DOCUMENTS

| | | | |
|---|---|---|---|
| 5,316,878 A | 5/1994 | Saito et al. ..................... 430/5 |
| 5,324,600 A | 6/1994 | Jinbo et al. ..................... 430/5 |
| 5,328,807 A | 7/1994 | Tanaka et al. .............. 430/311 |
| 5,334,542 A | 8/1994 | Saito et al. .................... 437/40 |
| 5,352,550 A | 10/1994 | Okamoto ....................... 430/5 |
| 5,364,716 A | 11/1994 | Nakagawa et al. ............. 430/5 |
| 5,424,154 A | 6/1995 | Borodovsky .................... 430/5 |
| 5,472,814 A | 12/1995 | Lin ................................ 430/5 |
| 5,480,746 A | 1/1996 | Jinbo et al. ..................... 430/5 |
| 5,496,666 A | 3/1996 | Chu et al. ....................... 430/5 |
| 5,498,579 A | 3/1996 | Borodovsky et al. ........ 437/250 |
| 5,503,951 A | 4/1996 | Flanders et al. ............... 430/5 |
| 5,523,186 A | 6/1996 | Lin et al. ........................ 430/5 |
| 5,527,645 A | 6/1996 | Pati et al. ....................... 430/5 |
| 5,532,090 A | 7/1996 | Borodovsky .................... 430/5 |
| 5,537,648 A | 7/1996 | Liebmann et al. .......... 395/500 |
| 5,538,815 A | 7/1996 | Oi et al. ......................... 430/5 |
| 5,539,568 A | 7/1996 | Lin et al. .................... 359/285 |
| 5,565,286 A | 10/1996 | Lin ................................ 430/5 |
| 5,573,890 A | 11/1996 | Spence ....................... 430/311 |
| 5,595,843 A | 1/1997 | Dao ............................... 430/5 |
| 5,620,816 A | 4/1997 | Dao ............................... 430/5 |
| 5,635,316 A | 6/1997 | Dao ............................... 430/5 |
| 5,636,131 A | 6/1997 | Liebmann et al. .......... 364/490 |
| 5,702,848 A | 12/1997 | Spence .......................... 430/5 |
| 5,725,969 A | 3/1998 | Lee ............................... 430/5 |
| 5,761,075 A | 6/1998 | Oi et al. ..................... 364/488 |
| 5,766,804 A | 6/1998 | Spence .......................... 430/5 |
| 5,766,806 A | 6/1998 | Spence .......................... 430/5 |
| 5,807,649 A | 9/1998 | Liebmann et al. .............. 430/5 |
| 5,827,623 A | 10/1998 | Ishida et al. .................... 430/5 |
| 5,858,580 A | 1/1999 | Wang et al. .................... 430/5 |
| 5,885,734 A | 3/1999 | Pierrat et al. ................... 430/5 |
| 5,923,562 A | 7/1999 | Liebmann et al. .......... 364/488 |
| 5,923,566 A | 7/1999 | Galan et al. ................ 364/489 |
| 5,994,002 A | 11/1999 | Matsuoka ....................... 430/5 |
| 5,998,068 A | 12/1999 | Matsuoka ....................... 430/5 |
| 6,004,702 A | 12/1999 | Lin ................................ 430/5 |
| 6,010,807 A | 1/2000 | Lin ................................ 430/5 |
| 6,057,063 A | 5/2000 | Liebmann et al. .............. 430/5 |
| 6,066,180 A | 5/2000 | Kim et al. ..................... 716/19 |
| 6,077,630 A | 6/2000 | Pierrat ........................... 430/5 |
| 6,083,275 A | 7/2000 | Heng et al. ................... 716/19 |
| 6,130,012 A | 10/2000 | May et al. ...................... 430/5 |
| 6,139,994 A | 10/2000 | Broeke et al. .................. 430/5 |
| 6,185,727 B1 | 2/2001 | Liebmann ..................... 716/19 |
| 6,228,539 B1 | 5/2001 | Wang et al. .................... 430/5 |
| 6,251,549 B1 | 6/2001 | Levenson ..................... 430/11 |
| 6,258,493 B1 | 7/2001 | Wang et al. .................... 430/5 |
| 6,335,128 B1 | 1/2002 | Cobb et al. ..................... 430/5 |
| 6,338,922 B1 | 1/2002 | Liebmann et al. .............. 430/5 |
| 6,420,074 B2 | 7/2002 | Wang et al. .................... 430/5 |
| 6,436,590 B2 | 8/2002 | Wang et al. .................... 430/5 |
| 2001/0000240 A1 | 4/2001 | Wang et al. .................... 430/5 |
| 2001/0028985 A1 | 10/2001 | Wang et al. .................... 430/5 |
| 2002/0008266 A1 * | 1/2002 | Kumagai et al. ............ 257/296 |
| 2002/0117722 A1 * | 8/2002 | Osada et al. ................. 257/379 |
| 2002/0127479 A1 | 9/2002 | Pierrat ........................... 430/5 |
| 2002/0129327 A1 | 9/2002 | Pierrat, et al. ................ 716/19 |
| 2002/0152454 A1 | 10/2002 | Cote, et al. ................... 716/21 |
| 2002/0155363 A1 | 10/2002 | Cote, et al. ..................... 430/5 |

OTHER PUBLICATIONS

Matsuoka, K., et al., "Application of Alternating Phase–Shifting Mask to 0.16um CMOS Logic Gate Patterns", Matsushita Electric Ind. Co., Ltd. (9 pages).

Spence, C., et al., "Detection of 60(degree) Phase Defects on Alternating PSMs", Advanced Micro Devices, KLA–Tencor, DuPont RTC (2 pages).

Sugawara, M., et al., "Defect Printability Study of Attenuated Phase–Shifting Masks for Specifying Inspection Sensitivity", Sony Corporation, Kanagawa, Japan (16 pages).

Schmidt, R., et al., "Impact of Coma on CD Control for Multiphase PSM Designs", AMD, ASML (11 pages).

Erdmann, A., "Topography Effects and Wave Aberrations in Advanced PSM–Technology", Fraunhofer Institute of Integrated Circuits (11 pages).

Granik, Y., et al., "CD Variation Anaylsis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronic, Inc. (10 pages).

Lin, B.J., "The Relative Importance of the Building Blocks for 193nm Optical Lithography", Linnovation, Inc. (12 pages).

McCallum, M., et al., "Alternation PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node ", Photronics, Inc., MIT Lincoln Lab, ARCH Chemicals, Finle Technologies, KLATencor Corp. (10 pages).

Ronse, K., et al., "Thin Film Interference Effects in Phse Shifting Masks Causing Phase and Transmittance Errors", IMEC (15 pages).

Rosenbluth, A., et al., "Optimum Mask and Source Patterns to Print a Given Shape", IBM (17 pages).

Sakata, M., et al., "A Novel Radiaion Sensitive Spin–on– Glass Convertible into SiO2 and the Simple Fabrication Process Using It", Oki Electric Industry Co. Ltd. (3 pages).

Schmidt, R., et al., "Impact of Coma on CD Control for Multiphase PSM Designs", AMD, ASML (10 pages).

Sewell, H., et. al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University , Vecor Technologies Inc. (8 pages).

Suzuki, A., et al., "Multilevel Imaging System Realizing k1=–.3 Lithogrpahy", Canon Inc. (13 pages).

Vandenberghe, G., et al., "(Sub–)100nm Gate Patterning Using 248nm Alternating PSM", IMEC, Mentor Graphic (9 pages).

Fritze, M., et al., "100–nm Node Lithography with KrF?", MIT Lincoln Lab, Numberical Technologies, Photronics, Arch Chemicals (14 pages).

Fakuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Mircroelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "Improving Resolution in Photolithography with a Phase–Shifting Mask", IEEE, Transactions On Electron Devices, vol. ED–29, No. 12, pp. 1828–1836, Dec. 1982.

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Produce Sizes in Openings in Photo Images Smaller Than Lithographic Minimum Size", IBM Technical Disclosure Bulletin, vol. 29, No. 3, p. 1328, Aug. 1986.

Terasawa, T., et al., "0.3–Micron Optical Lithography Using a Phase–Shifting Mask", SPIE, Optical/Laser Microlithography II, vol. 1088, pp. 25–33, Mar. 1989.

Buraschi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self–Aligned Phase Sifters for a Quarter Micro Photolithography", IEDM, pp. 3.3.1–3.3.4, Dec. 3–6, 1989.

Jinbo, H., et al., "0.2um or Less i–Line Lithography by Phase–Shifting–Mask Technology", IEEE, pp. 33.3.1–33.3.4 (1990).

Neureuther, A., "Modeling Phase Shifting Masks", SPIE, 10th Annual Symposium On Microlithography, vol. 1496, pp. 80–85 (1990).

Toh, K., et al., "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices and Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Burggraaf, P., "Four More Significant Japanese Advances in Phase Shfiting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulatin Techniques", SPIE—Optical/Laser Microlithography IV, vol. 1463, pp. 135–150 (1991).

Asai, S., et al., "High Performance Optical Lithography Using a Separated Light Source", J. Vac. Sci. Technol. B, vol. 10, No. 6, pp. 3023–3026, Nov./Dec. 1992.

Jinbo, H., et al., "Application of Blind Method to Phase–Shifting Lithography", IEEE, 1992 Symposium On VLSI Technology Digest Of Technical Papers, pp. 112–113 (1992).

Ohtsuka, H., et al., "Phase Defect Repair Method for Alternating Phase Shift Masks Conjugate Twin–Shifter Method", Jpn. J. Appl. Phys., vol. 31, pp. 4143–4149 (1992).

Pierrat, C., et al., "Phase–Shifting Mask Topography Effects on Lithographic Image Quality", IEEE, pp. 3.3.1–3.3.4 (1992).

Watanbe, H., et al., "Detection and Printability of Shifter Defects in Phase–Shifting Masks II Defocus Characteristics", Jpn. J. Appl. Phys., vol. 31, pp. 4155–4160 (1992).

Burggraaf, P., "Lithography's Leading Edge, Part 1: Phase–Shift Technology and Part 2: I–Line and Beyond", Semiconductor International, pp. 43–47 and 52–56, Feb. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Brunner, T., et al., "170nm Gates Fabricated by Phase–Shift Mask and Top Anti–Reflector Process", SPIE, Optical/Laser Microlithography VI, Vo. 1927, pp. 182–189 (1993).

Brunner, T., "Rim Phase–Shift Mask Combined with Off–Axis Illumination: A Path to 0.5(lamda) / Numerical Aperture Geometries", Optical Engineering, vol. 32, No. 10, pp. 2337–2343, Oct. 1993.

Lin, B.J., "Phase–Shifting Masks Gain an Edge", IEEE Circuits & Devices, pp. 28–35, Mar. 1993.

Liu, H.Y., et al., "Fabrication of 0.1um T–Shaped Gates by Phase–Shifting Optical Lithography", SPIE, Optical/Laser Microlithography VI, vol. 1927, pp. 42–52 (1993).

Nistler, J., et al., "Phase Shift Mask Defect Printability Analysis", Proceedings Of The Microlithography Seminar INTERFACE '93, OCG Microelectronic Materials, Inc. pp. 11–28 (1993).

Rieger, M., et al., "System for Lithography Proximity Compensation", Precim Company, Portland, Oregon, Sep. 1993 (28 pages).

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography:Maskmaking and its Application", J. Vac. Sci. Technol. B, vol. 11, No. 6, pp. 2669–2674, Nov./Dec. 1993.

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno, F., et al., "Practical Phase–Shifting Mask Technology for 0.3um Large Scale Integrations", J. Vac. Sci. Technol. B, vol. 12, No. 6, pp. 3799–3808, Nov./Dec. 1994.

Nistler, J., et al., "Large Area Optical Design Rule Checker for Logic PSM Application", SPIE, Photomask And X–Ray Mask Technology, vol. 2254, pp. 78–92 (1994).

Pati, Y. C., et al., "Phase–Shifting Masks for Microlithography: Automated Design and Mask Requirements", J. Opt. Soc. Am., vol. 11, No. 9, pp. 2438–2452, Sep. 1994.

Pierrat, C., et al., "A Rule–Based Approach to E–Beam and Process–Induced Proximity Effect Correctin for Phase–Shifting Mask Fabrication", SPIE, vol. 2194, pp. 298–309 (1994).

Spence, C., et al., "Automated Determination of CAD Layout Failures Through Focus: Experiment and Simulation", SPIE, vol. 2197, pp. 302–313 (1994).

Stirniman, J., et al., "Wafer Proximity Correction and Its Impact on Mask–Making", Bacus News, vol. 10, Issue 1, pp. 1, 3–7, 10–12, Jan. 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design"SPIE, Vo.2440, pp. 192–206, Feb. 1995.

Karklin, L., "A Comprehensive Simulation Study of the Photomask Defects Printability", SPIE, vol. 2621, pp. 490–504 (1995).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Isiwata, N., et al., "Novel Alternating Phase Shift Mask with Improved Phase Accuracy", SPIE, Proceedings Of The 17th Annual Symposium On Photomask Technology And Management, vol. 3236, pp. 243–249 (1997).

Morimoto, H., et al., "Next Generation Mask Strategy—Technologies are Ready for Mass Production of 256MDRAM?", SPIE, vol. 3236, pp. 188–189 (1997).

Roman, B., et al., "Implications of Device Processing on Photomask CD Requirements", SPIE, vol. 3236 (1997) (Abstract Only).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proprosal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Petersen, J., et al., "Designing Dual–Trench Alernating Phase–Shift Masks for 140nm and Smaller Features Using 248–nm KrF and 193–nm ArF Lithography", Bacus News, vol. 14, Issue 8, pp. 1 & 4–13, Aug. 1998.

Fukoda, H., et al., "Determination of High–Order Lens Aberration Using Phase/Amplitude Linear Algebra", J. Vac. Sci. Technol. B, vol. 17, No. 6, pp. 3318–3321, Nov./Dec. 1999.

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295,Nov./Dec. 1999.

Spence, C., et al., "Integration of Optical Proximity Correction Strategies in Strong Phase Shifters Design for Poly–Gate Layers", Bacus News, vol. 15, Issue 12, pp. 1, 4–13, Dec. 1999.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun. 2, 2000.

Pierrat, C., "Investigation of Proximity Effects in Alternating Aperture Phase Shifting Masks", Numerical Technologies, Inc. (11 pages).

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

Wang, R., et al., "Polarized Phase Shift Mask: Concept, Design, and Potential Advantages to Photlithography Process and Physical Design", Motorola Semiconductor Product Sector (12 pages).

Ogawa, K., et al., "Phase Defect Inspection by Differential Interference", Lasertec Corporation (12 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Jornal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, II., et al., "Evaluation of Repair Phase and Size Tolerance for a Phase–Shift Mask", J. Vac. Sci. Technol. B, vol. 11, No. 6, pp. 2665–2668, Nov./Dec. 1993.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Ohnuma, H., et al., "Lithography Computer Aided Design Technology for Embedded Memory in Logic", Jpn. J. Appl. Phys., vol. 37, Part I, No. 12B, pp. 6686–6688, Dec. 1998.

Kikuchi, K., et al., "Method of Expanding Process Window for the Double Exposure Technique with alt–PSMs", Optical Microlithography XIII, Proceeding of SPIE, vol. 4000, pp. 121–131 (2000).

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technique Based On Detailed Full–Chip CD Stimulation". SPIE, vol. 4182, pp. 335–341 (2000).

Plat, M., et al., "The Impact of Optical Enhancement Techniques on the Mask Error Enhancement Funchtion (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

* cited by examiner

PHASE SHIFTING DESIGN AND LAYOUT FOR STATIC RANDOM ACCESS MEMORY

RELATED APPLICATIONS

This application is related to, claims the benefit of priority of, and incorporates by reference, the U.S. Provisional Patent Application Serial No. 60/296,788 filed Jun. 8, 2001 entitled "Phase Conflict Resolution for Photolithographic Masks" having investors Christophe Pierrat and Michel Côé and assigned to the assignee of the present invention.

This application is related to, claims the benefit of priority of, and incorporates by reference, the U.S. Provisional Patent Application Serial No. 60/304,142 filed Jul. 10, 2001 entitled "Phase Conflict Resolution for Photolithographic Mask" having inventors Christophe Pierrat and Michel Côté and assigned to the assignee of the present invention.

This application is related to, claims the benefit of priority of, and incorporates by reference, the U.S. Provisional Patent Application Serial No. 60/325,689 filed Sep. 28, 2001 entitled "Cost Functions And Gate CD Reduction In Phase Shifting Photolithographic Masks" having inventors Christophe Pierrat and Michel Côté and assigned to the assignee of the present invention.

This application is related to, claims the benefit of priority of, and incorporates by reference, and is a continuation-in-part of the U.S. patent application Ser. No. 09/669,359 filed Sep. 26, 2000 entitled "Phase Shift Masking for Complex Patterns" having inventor Christophe Pierrat and assigned to the assignee of the present invention, which is related to U.S. Provisional Patent Application Serial No. 60/215,938 filed Jul. 5, 2000 entitled "Phase Shift Masking For Complex Layouts" having inventor Christophe Pierrat and assigned to the assignee of the present invention.

BACKGROUND OF THE INVENTION

1. Field of the Invention

The present invention relates to manufacturing small dimension features of objects, such as integrated circuits, using photolithographic masks. More particularly, the present invention relates to phase shift masking of complex layouts for integrated circuits and similar objects.

2. Description of Related Art

Phase shift masking has been applied to create small dimension features in integrated circuits. Typically the features have been limited to selected elements of the design, which have a small, critical dimension. See, for example, U.S. Pat. No. 5,766,806.

Although manufacturing of small dimension features in integrated circuits has resulted in improved speed and performance, it is desirable to apply phase shift masking more extensively in the manufacturing of such devices. However, the extension of phase shift masking to more complex designs results in a large increase in the complexity of the mask layout problem. For example, when laying out phase shift windows on dense designs, phase conflicts will occur. One type of phase conflict is a location in the layout at which two phase shift windows having the same phase are laid out in proximity to a feature to be exposed by the masks, such as by overlapping of the phase shift windows intended for implementation of adjacent lines in the exposure pattern. If the phase shift windows have the same phase, then they do not result in the optical interference necessary to create the desired feature. Thus, it is necessary to prevent inadvertent layout of phase shift windows in phase conflict near features to be formed in the layer defined by the mask.

In the design of a single integrated circuit, millions of features may be laid out. The burden on data processing resources for iterative operations over such large numbers of features can be huge, and in some cases makes the iterative operation impractical. The layout of phase shift windows and the assignment of phase shift values to such windows, for circuits in which a significant amount of the layout is accomplished by phase shifting, is one such iterative operation which has been impractical using prior art techniques.

Phase shifting layouts for memory cells have been developed that phase shift gate portions of the memory design for improved performance.

Because of these and other complexities, implementation of a phase shift masking technology for complex designs will require improvements in the approach to the design of phase shift masks.

SUMMARY OF THE INVENTION

Methods and apparatuses for fully defining static random access memory (SRAM) using phase shifting layouts are described. By producing the SRAM memory using a "full phase" mask, yield can be improved at smaller sizes (relative to using the same lithographic process with a non-phase shifting mask, particularly the wavelength of light, $\lambda$), integrated circuit density is improved by tighter packing of smaller memory cells, and also the performance of the memory can be improved.

The approach includes identifying that a layout includes SRAM cells and defining phase shifting regions in a mask description to fully define the SRAM cells. The identification may include an automated detection of layout patterns that correspond to SRAM cells, parameterized shape detection, user identification of SRAM cells either interactively through a user interface and/or through input parameters, and/or other identification approaches.

A region around the layout shapes for an SRAM cell can be identified where phase shifters will be placed in the mask definition. By placing shifters in this region, destructive interference of light of opposite phases will cause definition of the pattern. However, it is necessary to break, or cut, the phase windows in the region to fully permit definition of the feature using phase shifters of opposite phases on opposing edges of the layout shapes of the SRAM cell.

The cuts can be light transmissive phase shifters as well at intermediate phase values (continuous, 90, 60-120) relative to the primary phase shifters (0 and 180).

The portion of the SRAM memory cell layout that is more difficult to define using phase shifting generally comprises two T-shapes ("T's") with off-centered bars interlaced with one another. There are contacts at the base of the bars and four transistors on either end of the top of the T. There are two additional transistors disposed above the interlaced T portion.

Several locations where cuts will be admitted are used by embodiments of the invention: contact to contact, inside corners of the T's to field, back of T's to back of adjacent T's, contacts to field, and corners of T's to contacts. By selecting one or more of these cutting locations a phase shifting layout of the SRAM memory cell is possible.

Most mask layouts will select a single cutting pattern for all SRAM memory cells in a particular area. For example, the cutting pattern of using the inside corners of the T's to field together with the back of T's to back of adjacent T's for all SRAM memory cells could be used for all of the SRAM memory cells in a given integrated circuit.

Additionally, attention may be given to ensuring that corresponding features from one SRAM memory cell to another are defined using the same phase ordering. For example if the phase shifter on the left a given transistor is phase 0 and the one on the right is 180, then it may be desirable to ensure that the phase shifter on the left of the corresponding transistor on another SRAM memory cell is 0 and the one on the right is 180. This ensures consistency in the SRAM memory cell layout even if there is a light intensity imbalance between 0 and 180 degree phase shifters.

Embodiments of the invention can be viewed as methods of manufacturing an integrated circuit. Embodiments of the invention include phase shifting and/or complementary trim masks for use in defining a layer of material in a photolithographic process.

BRIEF DESCRIPTION OF THE FIGURES

The file of this patent contains at least one drawing executed in color. Copies of this patent with color drawing(s) will be provided by the Patent and Trademark Office upon request and payment of the necessary fee.

DETAILED DESCRIPTION

Overview

Layouts and arrangements for defining several types of patterns using phase shifting will be considered.

T-L Junction

Figure 1:
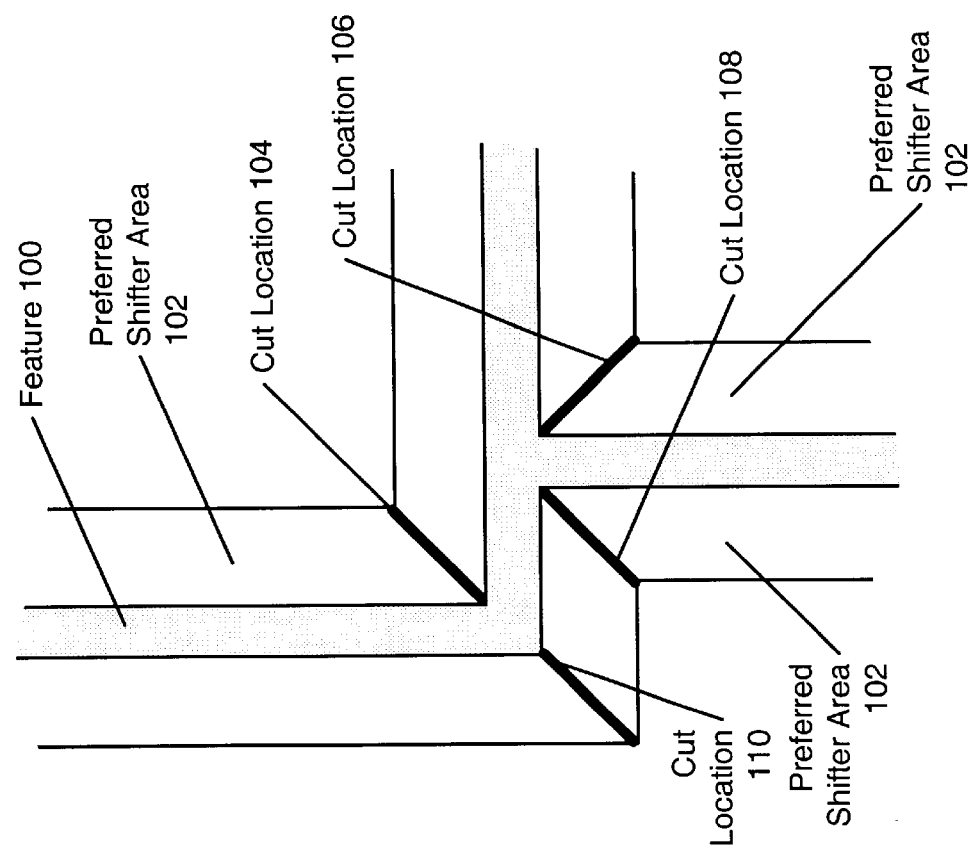
FIG. 1 illustrates a combination T-L junction.

FIG. 1 illustrates a combination T-L junction, specifically the layout of FIG. 1 includes the feature 100 that includes an L shape adjacent to a T shape. A preferred shifter area 102 is shown surrounding the feature 100. The preferred shifter area 102 corresponds to the preferred phase shifter width for use in defining the feature 100 using phase shifting. Further, cutting locations where shifters defined in the preferred shifter area 102 may be placed. Specifically, the cut locations 104, 106, 108, and 110 are identified.

Figure 2:
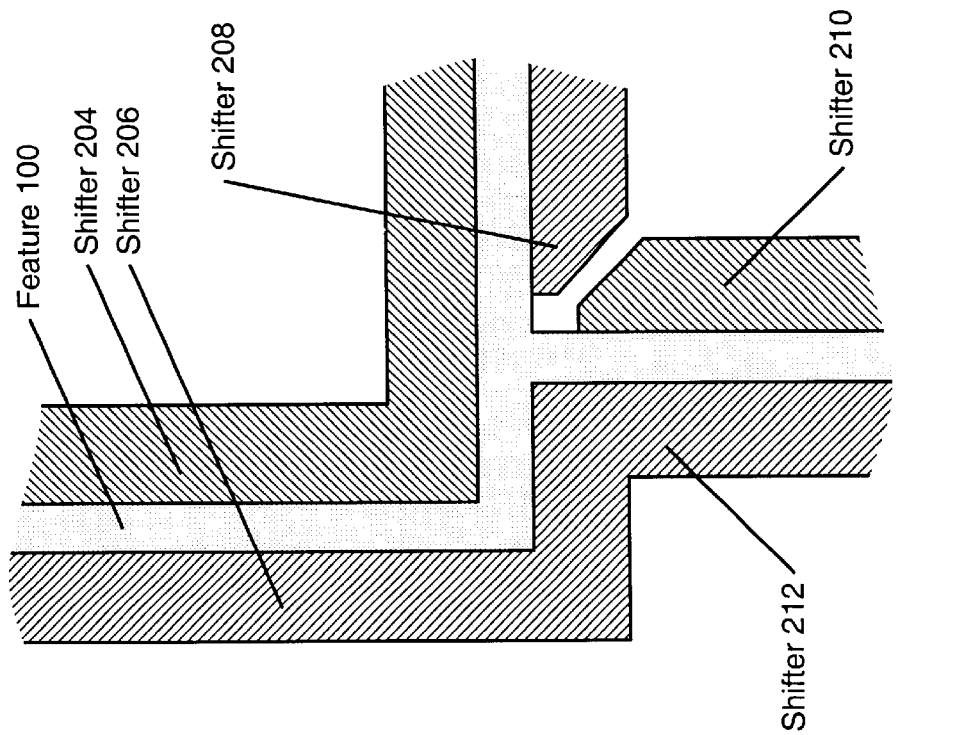
FIG. 2 illustrates a phase shifting layout for the T-L junction of FIG. 1.

FIG. 2 illustrates a phase shifting layout for the T-L junction of FIG. 1. More specifically, the cut location 106 was selected—to minimize the number of cuts—and thus four shifters: the shifter 204, the shifter 206, the shifter 208, and the shifter 210, are used to define the feature 100. The phase shifting layout (and corresponding mask) would include only the shifters. Additionally, a complimentary trim mask for use in conjunction with the layout of FIG. 2 can be developed. See, e.g., U.S. patent application Ser. No. 09/932,239, having inventors Christophe Pierrat, et. al., entitled "Phase Conflict Resolution for Photolithographic Masks", filed Aug. 17, 2001, and assigned to the assignee of the present application, which is incorporated herein by reference.

U Shapes

Figure 4:
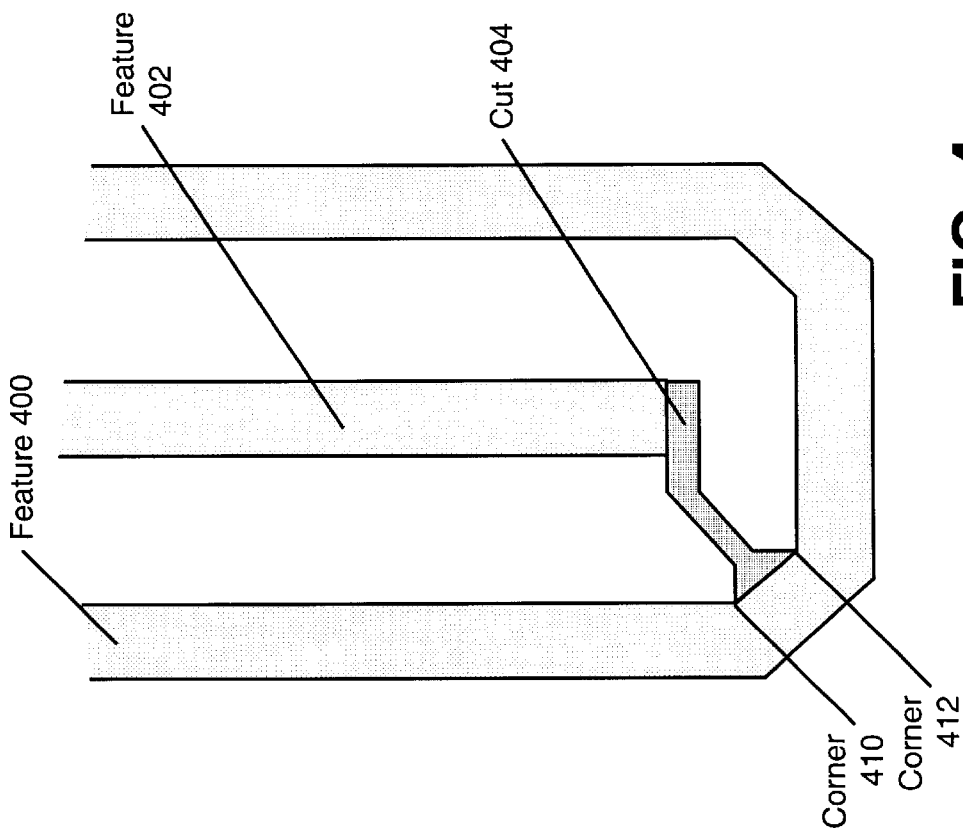
FIG. 4 illustrates a U layout with the cutting location indicated for the phase layout.
Figure 3:
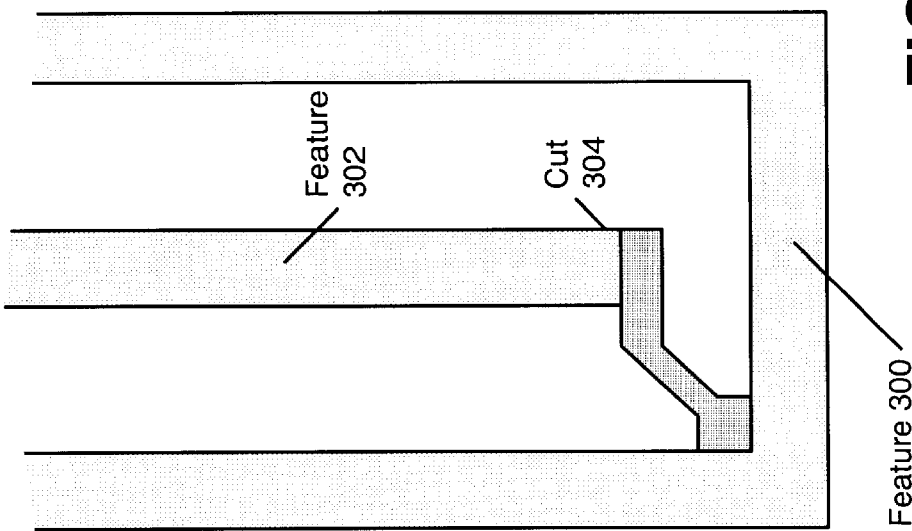
FIG. 3 illustrates a squared-U layout with the cutting location indicated for the phase layout.

Turning to FIGS. 3–4, two U-shaped layouts are shown. FIG. 3 illustrates a squared-U layout with the cutting location indicated for the phase layout. FIG. 4 illustrates a U layout with the cutting location indicated for the phase layout. In each, a single cut on the inside of the U will be used to separate the phase shifters (a corresponding cut can be used on the outside of the U).

Specifically, FIG. 3 includes the feature 300 and the feature 302. A single cut 304 extends from interior of the corner of the feature 300 towards the feature 302 and then runs parallel along the endcap of the feature 302. Similarly, in FIG. 4 the feature 400 and feature 402 comprise the layout pattern and a cut 404 is used in the interior. Additionally, with respect to FIG. 4, in some embodiments a slightly different cut shape is used in the interior bend of the U. Specifically, a corner 410 and a corner 412 are shown interior to the bended U. In some embodiments, the cut is centered about one of the two corners rather than the full length of the interior angled wall of the U.

H-Shapes

Figure 5:
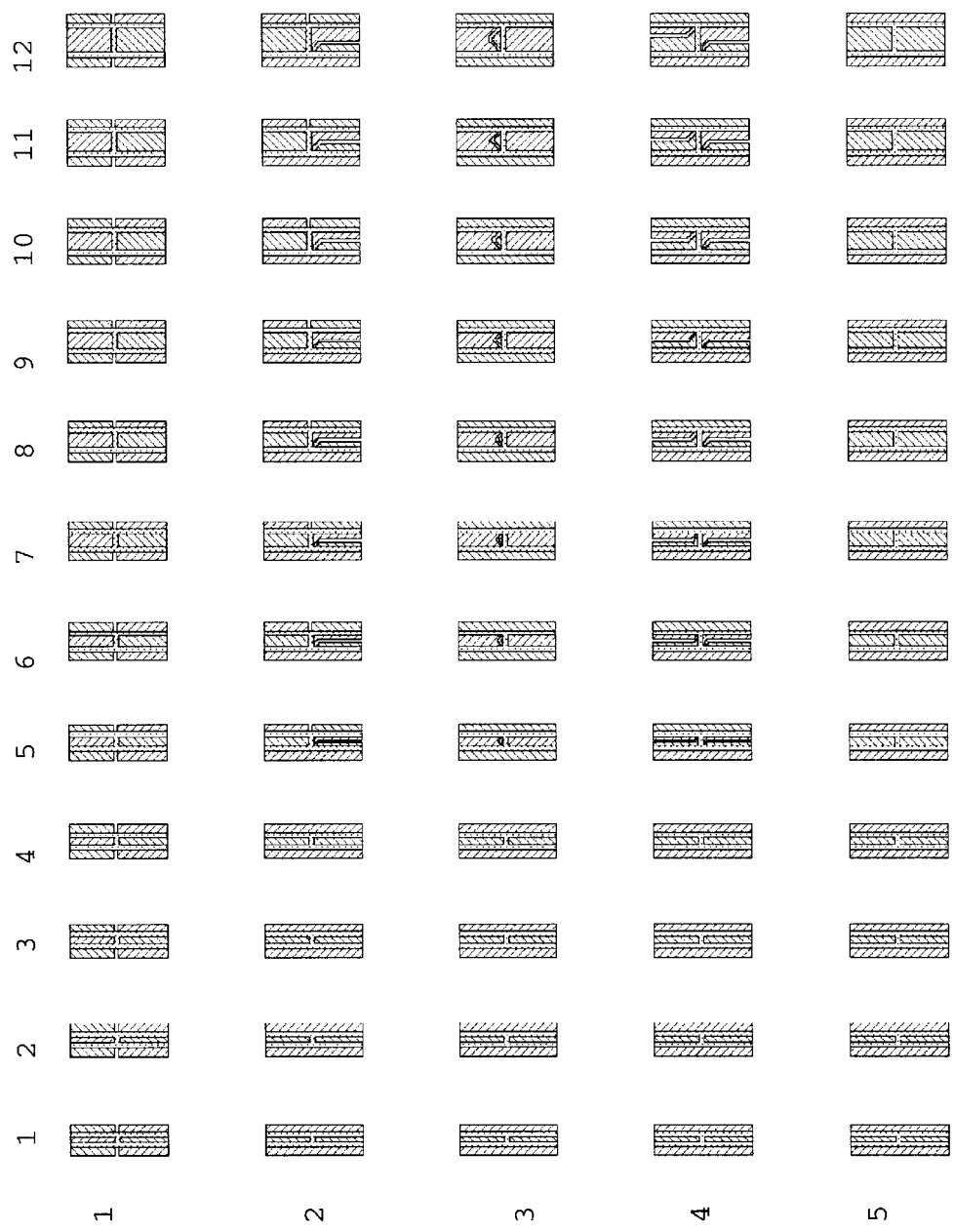
FIG. 5 illustrates a H shaped features with a variety of spacings and phase shift layout arrangements.

FIG. 5 includes a test pattern for H-shapes arranged in a 12 wide by 5 high grid. There are twelve different spacings between the vertical bars of the H shown across FIG. 5 and for each spacing, the column shows a possible shifter arrangement for that spacing. For clarity of reference, each H pattern can be referred to by its x-y position, e.g. (1,1) being the upper leftmost H and (12,5) being the bottom rightmost H. Thus, within a row the space between the bars of the H wider for the H (j',k) as compared to the H (j,k) where j'>j.

Which option is ultimately selected will depend on the surrounding environment, e.g. the adjacent polygons, as well as the process latitude. For example, the H shapes in the first row (1,1) . . . (12,1) are premised on the assumption that it will be possible to make a cut on both sides of the H. In contrast the H shapes in the second row assume only one cut is possible, e.g. H's (1,2) . . . (12,2). The remaining rows make no use of cuts on the outside of the H. But, may result in difficult to manufacture masks, e.g. H (5,3) which has a small phase shift area. Other patterns may allow the phase conflict by not using any cuts, H's (1,5) . . . (12,5). It should be noted that some of the H patterns in rows two through four lack adequate space to admit the cutting pattern used in the remainder of the row, c.f. H's (1,2) . . . (4,2), (1,3) . . . (4,3), and (1,4) . . . (4,4) with the remaining H's in those rows.

Figure 6:
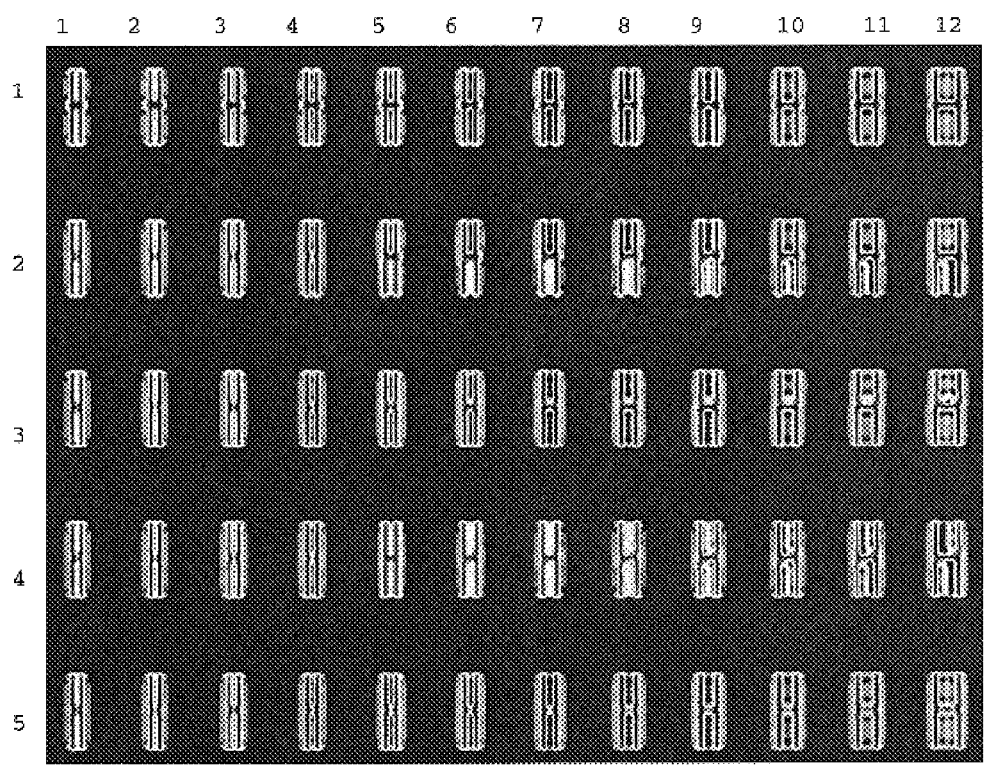
FIG. 6 is a simulation of the layout of FIG. 5.

In FIG. 6, a simulated aerial image of the test pattern of FIG. 5 is shown. The exposure conditions assumed that the phase shift mask was exposed with a 248 nm wavelength ($\lambda$) light, N.A.=0.75, and $\sigma$=0.5 and that the trim mask (not shown) was exposed using the same $\lambda$ and N.A., but with $\sigma$=0.5 and three times the dosage. As can be seen from the simulation in most cases the layouts will be correctable with optical proximity correction. However, there will be a resulting impact on process latitude. For example, the H (6,2) and the H (7,2) can likely print however there will be a limited amount of process latitude for the vertical lines. Similar problem, e.g. with H (5,4), but note that other H's in row four are more likely to be correctable with OPC, e.g. H's (8,4) . . . (12,4). In contrast note that in row five, the bars of the smaller H's are more easily corrected with OPC across the phase conflict, e.g. H's (1,5) . . . (4.5), while in contrast as the length of the phase conflict area increases correction with OPC becomes more difficult or perhaps impossible, e.g. H's (5,5) . . . (12,5).

Figure 7:
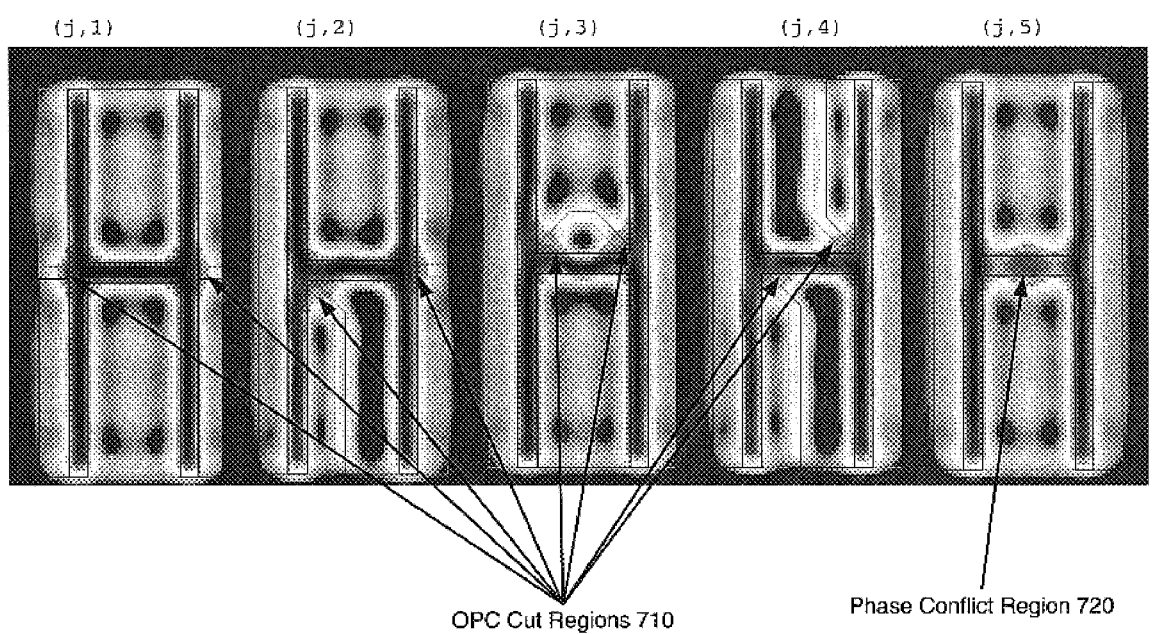
FIG. 7 includes portions of the simulation of FIG. 6 at higher magnification.

Turning to FIG. 7, a magnified view of the simulations for one of the columns, j, at separation 0.5 μm, is shown with the magnified images arranged sideways (e.g. top most row on the left, bottom most row on the right). As shown OPC correction can be applied in the OPC cut regions 710 and the phase conflict region 720. In some instances there may be insufficient process latitude to reliably print the feature, e.g. (j,5) may lack sufficient process latitude to reliably print on the wafer even with optical proximity correction.

SRAM Cutting

Figure 8:
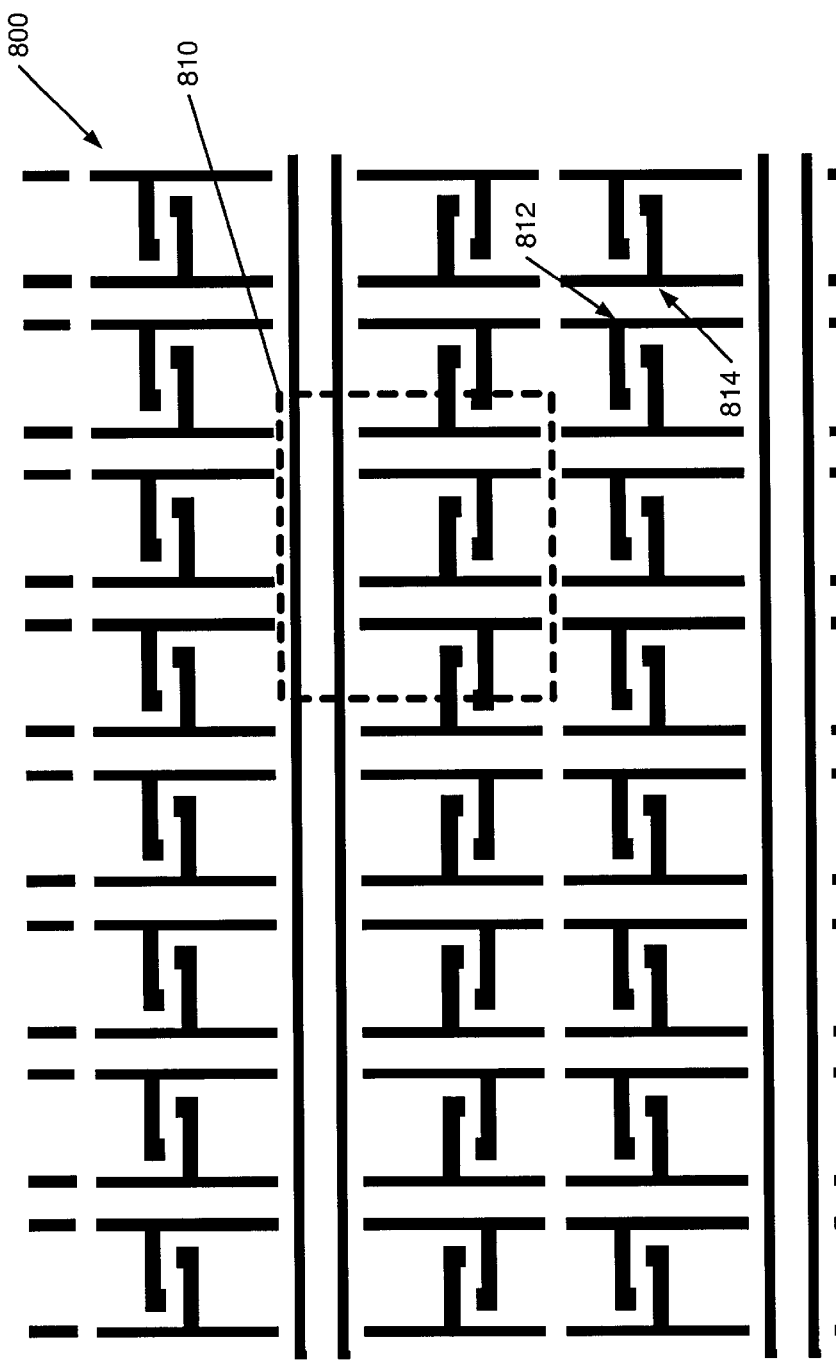
FIG. 8 illustrates a portion of a layout of an static random access memory (SRAM) cell being defined using phase shifting.

FIG. 8 illustrates a portion of a layout of an SRAM cell 800 being defined using phase shifting. The SRAM cell 800 is representative of common designs and includes a largely repeating pattern including a portion 810 which is surrounded by a heavy, dashed line. FIGS. 9–12 show several possible phase layouts for fully defining the layout of FIG. 8 using phase shifting.

Figure 9:
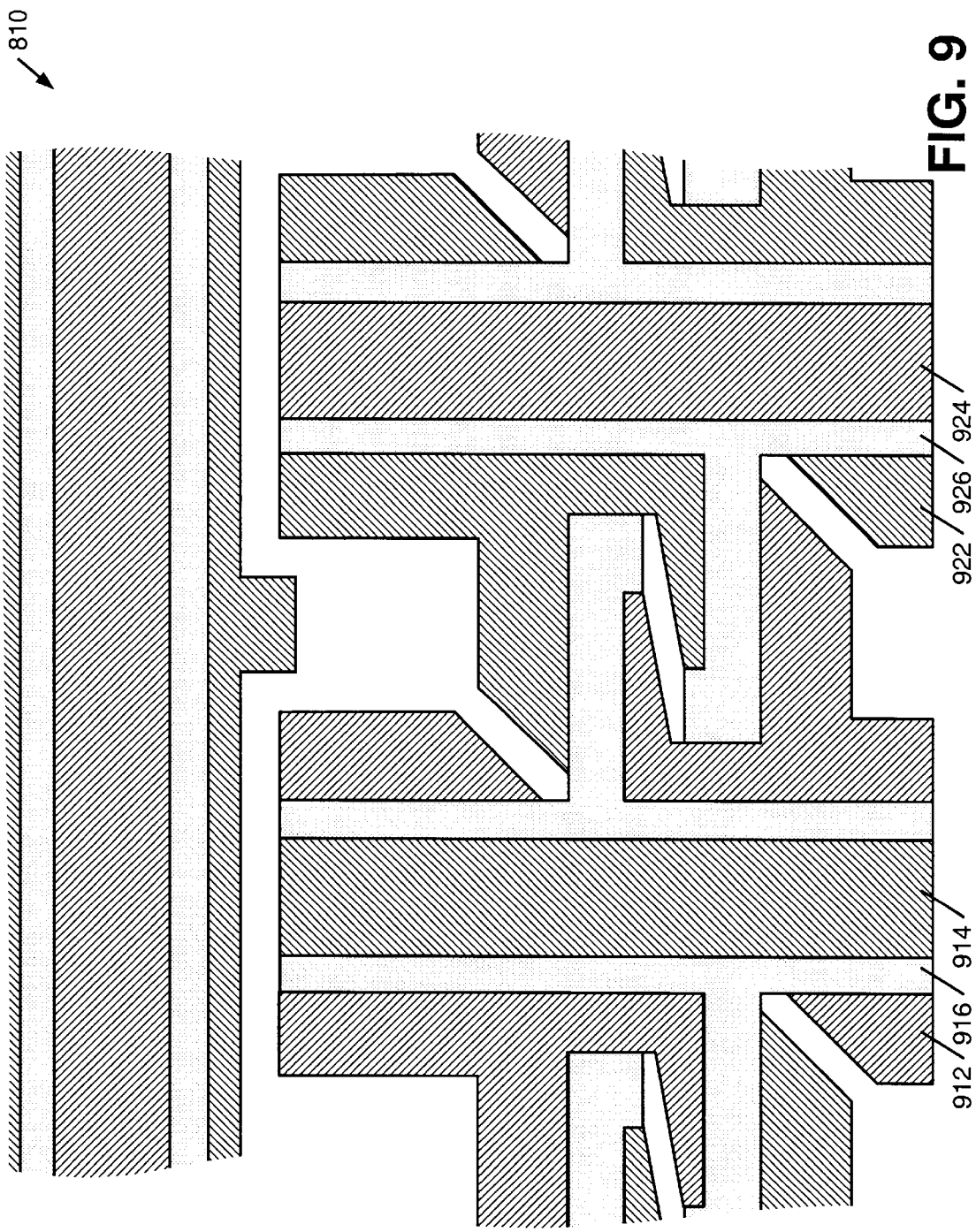
FIGS. 9–12 illustrate different phase layout designs for the SRAM cell of FIG. 8

Turning to FIG. 9, the portion 810 is shown with a phase shifting layout. The orientation of the cross hatching indicates the relative phase. For example, the phase shifter 912 and the phase shifter 914 have opposite phase (X,X+180) as indicated by the different directions of the cross hatching. The features defined by the shifters, e.g. feature 916, are shown for clarity but are not part of the layout itself.

The cutting arrangement used in FIG. 9 can be described as having a cut in the phase shifters between the two contacts as well as cuts in the inside corners of the T's opposite the cuts between the contacts.

As can be seen in FIG. 9, the particular cutting arrangement used cause corresponding features, e.g. the feature 916 and the feature 926, to be defined by a different shifter ordering, e.g. (X, X+180) vs. (X+180, X), as seen by the cross hatching on the shifter 912, 914, 922, and 924. This may be undesirable because there can be a light intensity imbalance between for example 0 and 180 degree phase shifters.

Thus, the same feature may print slightly differently depending on where it fell within the larger pattern of the cell. For example, if the 0 degree phase shifter is slightly more intense than the 180 degree shifter then the light imbalance will tend to move features slightly towards the 180 degree shifter. If the phase ordering is flipped from corresponding feature to corresponding feature then in some cases the features will print slightly to one side and on others slightly to the other side. As such it may be desirable to ensure that the cutting arrangement used to define the individual memory cells of the SRAM is such that the same feature is consistently defined using the same shifter ordering.

Figure 10:
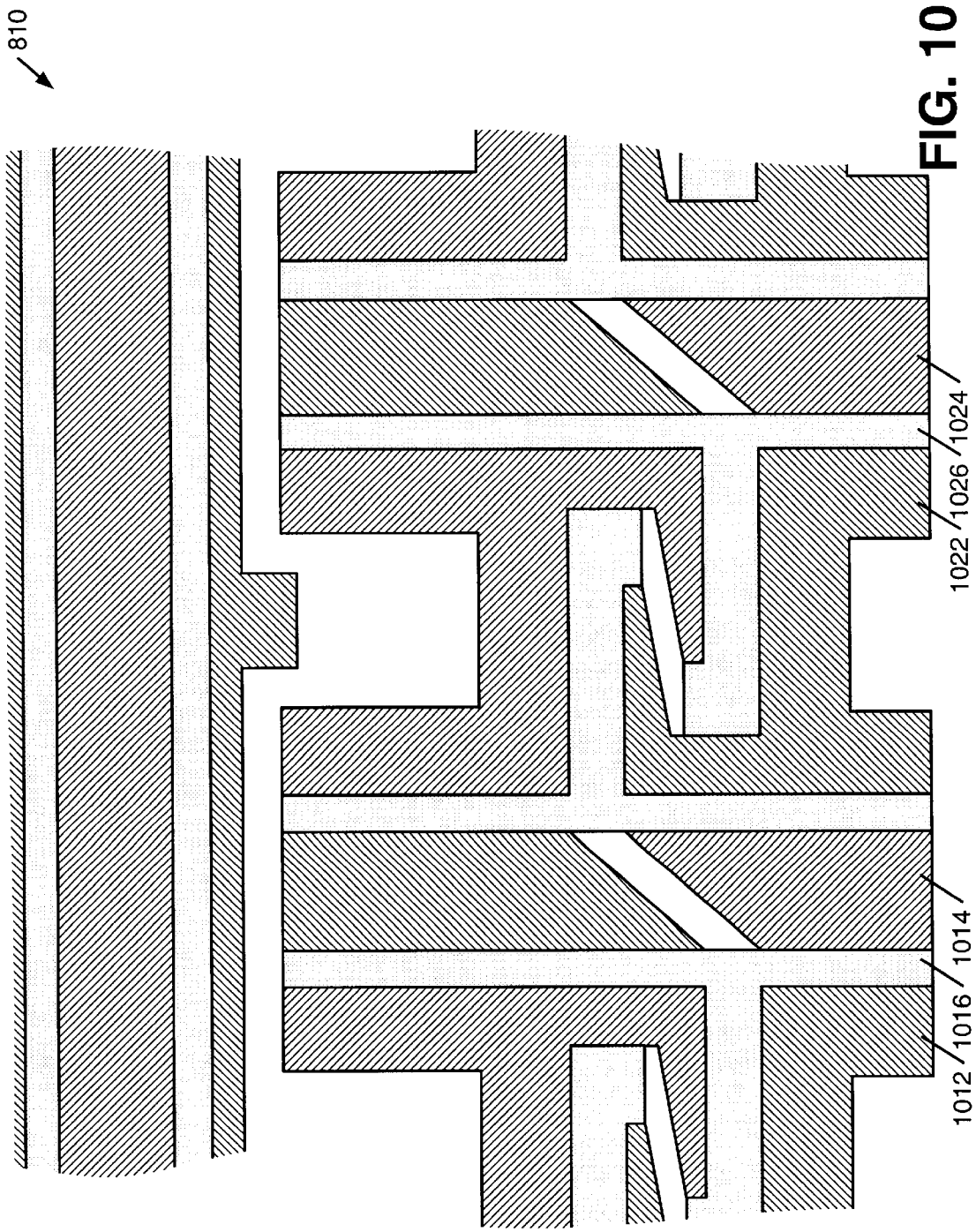

Such an arrangement is shown in FIG. 10. Specifically, the region 810 is shown with a different shifter and cutting arrangement. Here, the corresponding features, e.g. the feature 1016 and the feature 1026, are consistently defined using the same phase orderings, e.g. phase shifters 1012, 1014, 1022, and 1024.

The cutting arrangement used in FIG. 10 can be described as having a cut in the phase shifters between the two contacts as well as cuts on the back of the T's to the adjacent T-back.

Figure 11:
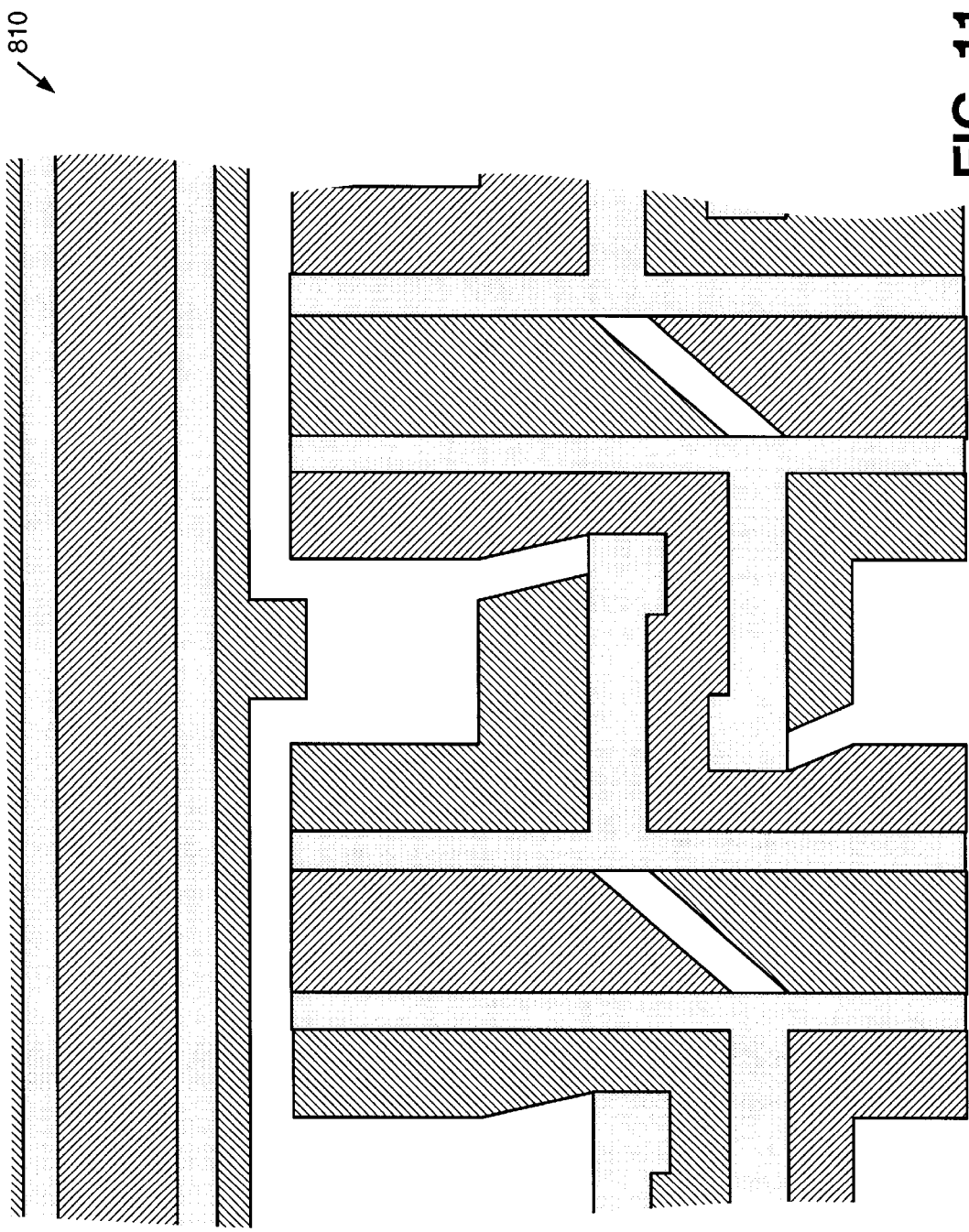

FIG. 11 shows a variation on the cutting arrangement of FIG. 10 however, like with FIG. 9 the cutting arrangement causes corresponding features to be defined using alternating phase patterns.

The cutting arrangement used in FIG. 11 can be described as having a cut in the phase shifters from the contact to the field as well as cuts on the back of the T's to the adjacent T-back.

Figure 12:
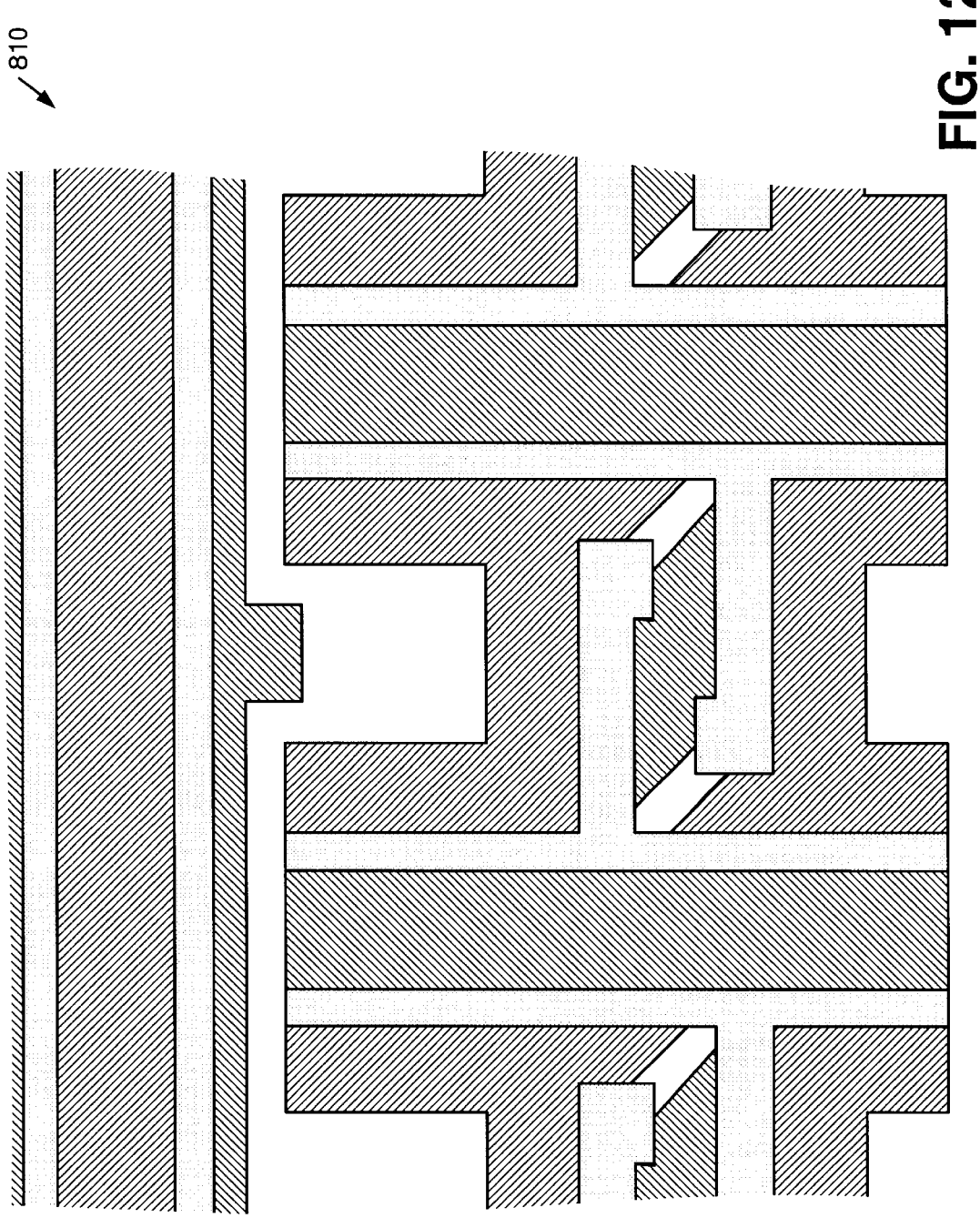

FIG. 12 shows a cutting arrangement that like FIG. 10 ensures that the corresponding features are defined using the same phase ordering.

The cutting arrangement used in FIG. 12 can be described as having cuts in the opposing corners of the T to the contact.

The particular cutting arrangement selected will depend on mask manufacturability concerns, the process design rules, and/or one or more simulations of the cutting arrangement for a given SRAM design and lithographic process.

It should also be noted that in some memory designs the horizontally disposed bars for contacts of adjacent memory cells are aligned. Specifically instead both a vertical and horizontal offset between bars 812 and bar 814, the adjacent horizontal bars are in vertical alignment. This would impact the cutting patterns by facilitating the use of straight line cuts between adjacent memory cells, c.f. FIG. 10 and FIG. 11 where a diagonal cut is used.

Representative Alternative Embodiments

Additionally, although the description has primarily focused on examples of defining a polysilicon, or "poly", layer within an IC, phase shifting can be used to define other layers of material, e.g. interconnects, metal, etc.

Although in many instances, an angled cut is shown as a preferred cutting arrangement, from a mask manufacturing perspective 90 degree cuts are more easily manufactured. Accordingly, in some embodiments, to the extent practical cuts at 90 degrees to the feature are selected in preference to other cuts. This works well at outside corners where the angled cut can be modified to a straight line cut.

Although the cut areas are shown as clear regions in fact a gradual, e.g. continuous, phase transition can be used as can a tri- or quad-tone mask, e.g. 0-90-180 or 0-60-120-180, with the middle phase values used in the cut openings.

Some embodiments of the invention include computer programs for performing the processes of defining the phase shifting layers and/or corresponding trim layers. In one embodiment, the process is implemented using the abraCAD (™) software produced by Cadabra Design Automation, a Numerical Technologies company, San Jose, Calif. In some embodiments, the computer programs are stored in computer readable media, e.g. CD-ROM, DVD, etc. In other embodiments, the computer programs are embodied in an electromagnetic carrier wave. For example, the electromagnetic carrier wave may include the programs being accessed over a network.

As used herein, the term optical lithography refers processes that include the use of visible, ultraviolet, deep ultraviolet, extreme ultraviolet, x-ray, e-beam, and other radiation sources for lithography purposes. The masks designs used should be appropriately adapted, e.g. reflective vs. transmissive, etc., to the particular lithographic process.

Conclusion

The foregoing description of embodiments of the invention has been provided for the purposes of illustration and description. It is not intended to be exhaustive or to limit the invention to the precise form disclosed. Many modifications and variations will be apparent. The embodiments were chosen and described in order to best explain the principles of the invention and its practical application, thereby enabling others to understand the invention for various embodiments and with various modifications as are suited to the particular use contemplated. It is intended that the scope of the invention be defined by the following claims.

We claim:

1. A method for producing a computer readable definition of a photolithographic mask that defines a pattern in a layer to be formed using the mask, wherein the pattern includes a plurality of features corresponding to a plurality of static random access memory (SRAM) cells, the plurality of features including two opposing T-shapes in a field for each SRAM cell, the T-shapes generally shaped like a T, a T-shape having a top with a back, and a bar, the top and the bar forming inside comas, and having a contact on the bar, the method comprising:

selecting a cutting pattern from a set of patterns including at least (i) a first cutting pattern comprising a first cut between two contacts of each SRAM cell and a second and third cuts, the second and third cuts on inside corners of the T-shapes of each SRAM cell opposite the first cut, (ii) a second cutting pattern comprising a first cut between two contacts of each SRAM cell and a second cut on the back of the T-shape of each SRAM cell to the back of a T-shape of an adjacent SRAM cell, (iii) a third cutting pattern comprising a first cut and a second cut from contacts of the SRAM cell to the field and a third cut on the back of the T-shape of the SRAM cell to the back of a T-shape of an adjacent SRAM, and (iv) a fourth cutting pattern comprising a first cut and a second cut extending respectively from opposing inside corners of one of the two T-shapes of each SRAM cell to the contacts on the bars of the other of the two T-shapes of each SRAM cell, for use in defining the plurality of SRAM cells; and defining a plurality of phase shifters in the computer readable definition of the mask to fully define the plurality of SRAM cells using destructive light interference, wherein the plurality of phase shifters separated by cuts according to the cutting pattern.

2. The method of claim 1, wherein the plurality of features have a first gate critical dimension, and wherein the defining a plurality of phase shifters further comprises defining the plurality of phase shifters such that the gate critical dimension less then the first gate critical dimension.

3. The method of claim 1, further comprising defining a computer readable definition of a second mask, the second mask comprising a complementary trim mask for use in conjunction with the mask and for preserving structure defined by the mask and clearing artifacts created by use of the mask.

4. The method of claim 3, further comprising manufacturing a photolithographic mask using the computer readable definition of the mask and the computer readable definition of the second mask.

5. The method of claim 1, wherein the pattern corresponds to a pattern for an SRAM memory chip.

6. A method of manufacturing an integrated circuit product, the method comprising:

identifying a pattern comprised of a plurality of features in a description of a layer of material in the integrated circuit, the pattern corresponding to a plurality of SRAM cells, the plurality of features including two opposing T-shapes in a field for each SRAM cell, the T-shapes generally shaped like a T, a T-shape having a top with a back, and a bar, the top and the bar forming inside corners, and having a contact on the bar;

defining a computer readable definition of a first mask, the first mask comprised of a plurality of phase shifters disposed on an opaque field, the phase shifters disposed such that destructive light interference between adjacent phase shifters defines the pattern, wherein the disposition of the phase shifters according to cuts between locations in the pattern corresponding to one or more of contacts to contacts, back of a T-shape to back of an adjacent T-shape, contacts to inside corners of T-shapes, contacts to field, and inside corners of T-shapes to field;

defining a computer readable definition of a second mask, the second mask including protective opaque regions on a clear field for protecting the pattern defined using the first mask and clearing artifacts created by the first mask; and defining a layer of material in the integrated circuit using a mask produced from the computer readable definition of the first mask and the computer readable definition of the second mask.

7. The method of claim 6, wherein the integrated circuit comprises an SRAM memory chip.

8. The method of claim 6, wherein the cuts defined such that corresponding structures of different SRAM cells consistently defined using a particular phase ordering.

9. The method of claim 8, wherein the cuts comprise contact to contact and back of T-shape to back of an adjacent T-shape cut.

10. The method of claim 6, wherein the cuts comprise phase shifting regions of phase different from those used by the plurality of phase shifters.

11. The method of claim 10, wherein the cut regions have phase 60 degrees and 120 degrees relative to said phase shifters.

12. The method of claim 10, wherein the cut regions have phase 90 degrees relative to said phase shifters.

13. A photolithographic mask for defining a layer of material, the layer of material including a pattern, the pattern corresponding to a plurality of SRAM cells, the photolithographic mask comprising a dark field mask with a plurality of light transmissive phase shifting regions disposed therein, the disposition of the phase shifting regions such that destructive light interference between the light transmissive phase shifting regions defines the plurality of SRAM cells, the plurality of features including two opposing T-shapes in a field for each SRAM cell, the T-shapes generally shaped like a T, a T-shape having a top with a back, and a bar, the top and the bar forming inside corners, and having a contact on the bar, and according to cuts between locations in the pattern corresponding to one or more of contacts to contacts, back of a T-shape to back of an adjacent T-shape, contacts to inside corners of T-shapes, contacts to field, and inside corners of T-shapes to field.

14. The mask of claim 13, wherein the mask for use in defining a layer of material for an SRAM memory chip.

15. The mask of claim 13, wherein substantially all of the structure of each of the plurality of SRAM cells defined by the destructive interference created by the positioning of the phase shifting regions.

16. An apparatus for creating computer readable definition of a mask, the apparatus comprising:

means for identifying a pattern, the pattern comprising a plurality of SRAM memory cells in a layout, SRAM memory cells including two opposing T-shapes in a field for each SRAM cell, the T-shapes generally shaped like a T, a T-shape having a top with a back, and a bar, the top and the bar forming inside corners, and having a contact on the bar; means for defining a phase shifting region around the pattern, and means for dividing the phase shifting region into a plurality of phase shifters for defining the pattern such that the pattern is fully defined using the plurality of phase shifters, and the phase shifters divided by a plurality of cuts between one or more of locations in the pattern corresponding to one or more of contacts to contacts, back of a T-shape to back of an adjacent T-shape, contacts to inside corners of T-shapes, contacts to field, and inside corners of T-shapes to field.

17. The apparatus of claim 16, wherein the mask for use in defining a layer of material for an SRAM memory chip.

18. The apparatus of claim 16, further comprising means for defining a computer readable definition of a complimentary mask, the complimentary mask for use in conjunction with the mask to protect the pattern defined using the mask and to clear artifacts created by the first mask.

19. The apparatus of claim 16, wherein the cuts comprise phase shifting regions having intermediate phase angles relative to the plurality of phase shifters.

20. A method for producing a computer readable definition of a photolithographic mask that defines a pattern in a layer to be formed using the mask, wherein the pattern includes a plurality of features corresponding to a plurality of static random access memory (SRAM) cells, the plurality of features including two opposing T-shapes in a field for each SRAM cell, the T-shapes generally shaped like a T, a T-shape having a ton with a back, and a bar, the top and the bar forming inside corners, and having a contact on the bar, the method comprising defining a plurality of phase shifters in the computer readable definition of the mask to fully define the plurality of SRAM cells using destructive light interference, wherein the plurality of phase shifters separated by cuts comprised of a first cut between two contacts of each SRAM cell and second and third cuts, the second and third cuts on inside corners of T-shapes of each SRAM cell opposite the first cut.

21. A method for producing a computer readable definition of a photolithographic mask that defines a pattern in a layer to be formed using the mask, wherein the pattern includes a plurality of features corresponding to a plurality of static random access memory (SRAM) cells, the plurality of features including two opposing T-shapes in a field for each SRAM cell, the T-shapes generally shaped like a T, a T-shape having a top with a back, and a bar, the top and the bar forming inside corners, and having a contact on the bar, the method comprising defining a plurality of phase shifters in the computer readable definition of the mask to fully define the plurality of SRAM cells using destructive light interference, wherein the plurality of phase shifters separated by cuts comprised of a first cut between two contacts of each SRAM cell and a second cut on back of a T-shape of each SRAM cell to back of a T-shape of an adjacent SRAM cell.

22. A method for producing a computer readable definition of a photolithographic mask that defines a pattern in a layer to be formed using the mask, wherein the pattern includes a plurality of features corresponding to a plurality of static random access memory (SRAM) cells, the plurality of features including two opposing T-shapes in a field for each SRAM cell, the T-shapes generally shaped like a T, a T-shape having a top with a back, and a bar, the top and the bar forming inside corners, and having a contact on the bar, the method comprising defining a plurality of phase shifters in the computer readable definition of the mask to fully define the plurality of SRAM cells using destructive light interference, wherein the plurality of phase shifters separated by cuts comprised of a first cut and second cut from contacts of an SRAM cell to field and a third cut from a back of a T-shape of the SRAM cell to back of a T-shape of an adjacent SRAM cell.

23. A method for producing a computer readable definition of a photolithographic mask that defines a pattern in a layer to be formed using the mask, wherein the pattern includes a plurality of features corresponding to a plurality of static random access memory (SRAM) cells, the plurality of features including two opposing T-shapes in a field for each SRAM cell, the T-shapes generally shaped like a T, a T-shape having a top with a back, and a bar, the top and the bar forming inside corners, and having a contact on the bar the method comprising defining a plurality of phase shifters in the computer readable definition of the mask to fully define the plurality of SRAM cells using destructive light interference, wherein the plurality of phase shifters separated by cuts comprised of a first cut and a second cut in opposing corners of the T-shapes of each SRAM cell to contacts.

24. An electromagnetic wave form comprising a computer program, the computer program for defining a mask layout, the computer program comprising:
  a first set of instructions for identifying a pattern comprised of a plurality of features in a description of a layer of material in the integrated circuit, the pattern corresponding to a plurality of SRAM cells, the plurality of features including two opposing T-shapes in a field for each SRAM cell, the T-shapes generally shaped like a T, a T-shape having a top with a back, and a bar, the toy and the bar forming inside corners and having a contact on the bar;
  a second set of instructions for defining a computer readable definition of a first mask, the first mask comprised of a plurality of phase shifters disposed on an opaque field, the phase shifters disposed such that destructive light interference between adjacent phase shifters defines the pattern, wherein the disposition of the phase shifters according to cuts between locations in the pattern corresponding to one or more of contacts to contacts back of a T-shape to back of an adjacent T-shape, contacts to inside corners of T-shapes, contacts to field, and inside corners of T-shapes to field;
  a third set of instructions for defining a computer readable definition of a second mask, the second mask including protective opaque regions on a clear field for protecting the pattern defined using the first mask and clearing artifacts created by the first mask; and
  a fourth set of instructions for defining a layer of material in the integrated circuit using a mask produced from the computer readable definition of the first mask and the computer readable definition of the second mask.

* * * * *

UNITED STATES PATENT AND TRADEMARK OFFICE
CERTIFICATE OF CORRECTION

PATENT NO. : 6,681,379 B2
DATED : January 20, 2004
INVENTOR(S) : Christophe Pierrat and Michel Luc Cote It is certified that error appears in the above-identified patent and that said Letters Patent is hereby corrected as shown below:

Column 7,
Line 10, delete "comas" and insert -- corners --;

Column 9,
Line 27, delete "ton" and insert -- top --;

Column 10,
Line 27, delete "wave form" and insert -- waveform --;
Line 37, delete "toy" and insert -- top --.

Signed and Sealed this

Sixth Day of July, 2004

JON W. DUDAS
*Acting Director of the United States Patent and Trademark Office*